(12) United States Patent
Ikeda et al.

(10) Patent No.: US 12,444,574 B2
(45) Date of Patent: Oct. 14, 2025

(54) PLASMA PROCESSING APPARATUS, AND PLASMA PROCESSING METHOD

(71) Applicant: TOKYO ELECTRON LIMITED, Tokyo (JP)

(72) Inventors: Taro Ikeda, Nirasaki (JP); Mitsutoshi Ashida, Nirasaki (JP); Eiki Kamata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 211 days.

(21) Appl. No.: 18/282,775

(22) PCT Filed: Mar. 14, 2022

(86) PCT No.: PCT/JP2022/011208
§ 371 (c)(1),
(2) Date: Sep. 18, 2023

(87) PCT Pub. No.: WO2022/202432
PCT Pub. Date: Sep. 29, 2022

(65) Prior Publication Data
US 2024/0170260 A1    May 23, 2024

(30) Foreign Application Priority Data
Mar. 26, 2021  (JP) .................. 2021-053311

(51) Int. Cl.
*H01J 37/32*   (2006.01)
*H01J 37/16*   (2006.01)
*H01L 21/3065* (2006.01)

(52) U.S. Cl.
CPC ........ *H01J 37/32229* (2013.01); *H01J 37/16* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 5,173,641 A | * | 12/1992 | Imahashi ......... H01J 37/32192 315/111.41 |
| 6,638,392 B2 | * | 10/2003 | Yamamoto ......... H01J 37/3244 118/723 MW |

(Continued)

FOREIGN PATENT DOCUMENTS

JP    2020-170643 A    10/2020

OTHER PUBLICATIONS

PCT International Search Report and Written Opinion, PCT Application No. PCT/JP2022/011208, May 10, 2022, 8 pages, (with English translation of PCT International Search Report).

*Primary Examiner* — Allan W. Olsen
(74) *Attorney, Agent, or Firm* — Fenwick & West LLP

(57) ABSTRACT

There is provided a plasma processing apparatus comprising: a processing container configured such that a substrate is subjected to plasma processing; a dielectric top plate which is quadrangular and which is provided to close an upper opening of the processing container; and a conductor plate supporting the dielectric top plate and having four electromagnetic wave emitting ports for emitting electromagnetic waves to the dielectric top plate. Each of the four electromagnetic wave emitting ports has a rectangular shape having long side and short side, the electromagnetic wave emitting ports are arranged such that the long side of each of the four electromagnetic wave emitting ports are parallel to the closest side among four sides of the dielectric top plate forming the quadrangular shape, and the long sides of the two electromagnetic wave emitting ports oriented in a same direction do not overlap each other in the same direction.

18 Claims, 10 Drawing Sheets

(56) References Cited

U.S. PATENT DOCUMENTS

| | | | | |
|---|---|---|---|---|
| 6,829,279 | B1* | 12/2004 | Ohmi | H01S 3/0315 |
| | | | | 372/50.1 |
| 7,723,637 | B2* | 5/2010 | Ohmi | H05H 1/46 |
| | | | | 219/121.48 |
| 2004/0107910 | A1* | 6/2004 | Nakata | H01J 37/32229 |
| | | | | 118/723 MW |
| 2004/0206729 | A1* | 10/2004 | Shinohara | H01J 37/32192 |
| | | | | 219/121.43 |
| 2005/0145178 | A1* | 7/2005 | Taguchi | H01J 37/32211 |
| | | | | 118/723 MW |
| 2005/0257891 | A1* | 11/2005 | Goto | C23C 16/511 |
| | | | | 118/723 MW |
| 2007/0235425 | A1* | 10/2007 | Oka | H01J 37/32192 |
| | | | | 219/121.43 |
| 2008/0099447 | A1* | 5/2008 | Ando | H01J 37/32229 |
| | | | | 219/121.43 |
| 2015/0171033 | A1* | 6/2015 | Seler | H01L 23/5389 |
| | | | | 257/664 |

\* cited by examiner

FIG.4
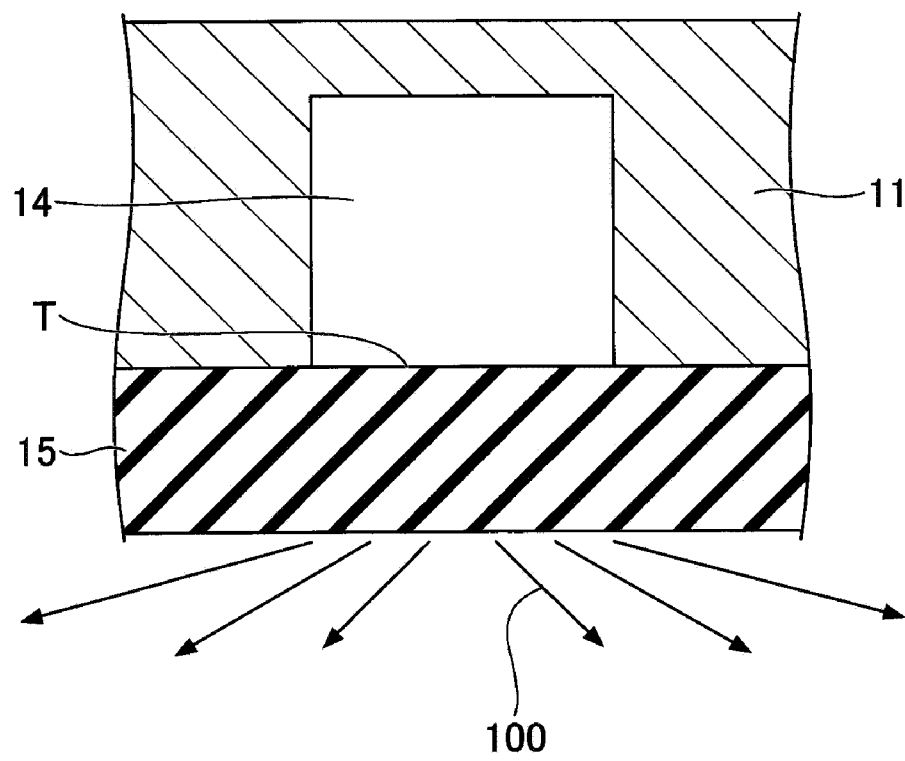
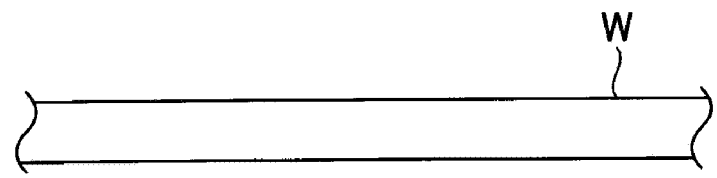

FIG.5

$$\begin{pmatrix} b_1 \\ b_2 \\ b_3 \\ b_4 \end{pmatrix} = \begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix} \begin{pmatrix} a_1 \\ a_2 \\ a_3 \\ a_4 \end{pmatrix}$$

SYSTEM SYMMETRY $$= \begin{pmatrix} S_{11} & S_{12} & S_{13} & S_{14} \\ S_{12} & S_{22} & S_{23} & S_{24} \\ S_{13} & S_{23} & S_{33} & S_{34} \\ S_{14} & S_{24} & S_{34} & S_{44} \end{pmatrix} \begin{pmatrix} a_1 \\ a_2 \\ a_3 \\ a_4 \end{pmatrix}$$

$$= \begin{pmatrix} 0.17 & 0.04 & 0.08 & 0.05 \\ 0.04 & 0.17 & 0.05 & 0.08 \\ 0.08 & 0.05 & 0.18 & 0.05 \\ 0.05 & 0.08 & 0.05 & 0.17 \end{pmatrix} \begin{pmatrix} a_1 \\ a_2 \\ a_3 \\ a_4 \end{pmatrix}$$

SLOT LENGTH=60mm

SLOT LENGTH=70mm

SLOT LENGTH=80mm

FIG. 9
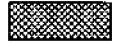
(a)
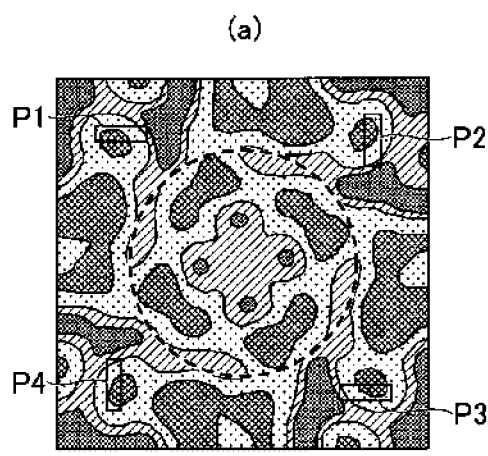
| P1 | P2 | P3 | P4 |
|----|----|----|----|
| 0° | 0° | 0° | 0° |
(b)
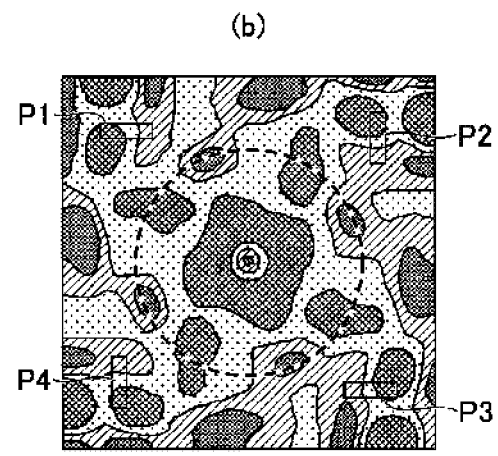
| P1 | P2 | P3 | P4 |
|----|----|----|----|
| 0° | 180° | 0° | 180° |
(c)
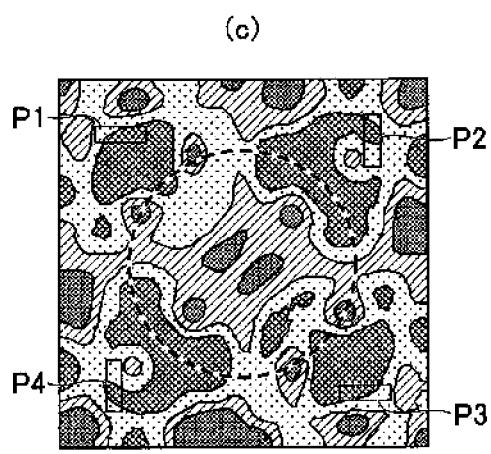
| P1 | P2 | P3 | P4 |
|----|----|----|----|
| 0° | 0° | 180° | 180° |
(d)
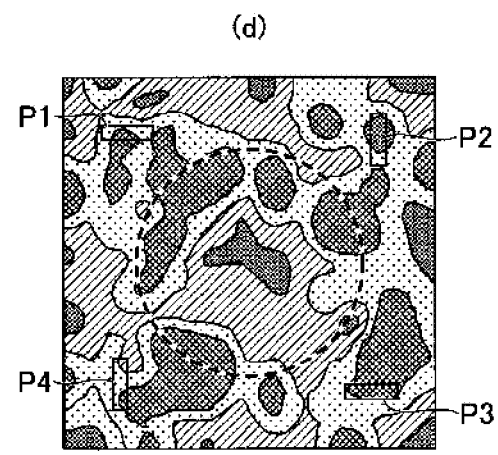
| P1 | P2 | P3 | P4 |
|----|----|----|----|
| 0° | 60° | 120° | 180° | om
PLASMA PROCESSING APPARATUS, AND PLASMA PROCESSING METHOD

TECHNICAL FIELD

An exemplary embodiment of the present disclosure relates to a plasma processing apparatus and a plasma processing method.

BACKGROUND

For example, Patent Document 1 discloses a plasma processing method that is performed in a plasma processing apparatus including a stage on which a substrate is mounted in a chamber, a plurality of electromagnetic wave emission means emitting a plurality of electromagnetic waves from a plurality of emitting parts, and a dielectric window disposed between the plurality of emitting parts and the stage. The plasma processing method includes the step of controlling phases of the plurality of electromagnetic waves emitted from the plurality of electromagnetic wave emission means, the step of emitting a plurality of phase-controlled electromagnetic waves into the chamber from the plurality of corresponding emitting parts, and the step of processing the substrate with localized plasma generated between the dielectric window and the stage.

PRIOR ART DOCUMENTS

Patent Documents

Patent Document 1: Japanese Laid-open Patent Publication No. 2020-170643

SUMMARY

Problems to Be Resolved by the Invention

The present disclosure provides a technology capable of eliminating interference of electromagnetic waves emitted from a plurality of electromagnetic wave emitting ports with each electromagnetic wave emitting port.

Means for Solving the Problems

In one exemplary embodiment, a plasma processing apparatus is provided. The plasma processing apparatus plasma includes a processing container configured such that a substrate to be processed is subjected to plasma processing, a dielectric top plate which is quadrangular in a plan view and which is provided to close an upper opening in the processing container, and a conductor plate which supports the dielectric top plate and has electromagnetic wave emitting ports for emitting electromagnetic waves to the dielectric top plate. The electromagnetic wave emitting ports have a rectangular shape having long sides and short sides in a plan view, and there are four electromagnetic wave emitting ports. The electromagnetic wave emitting ports are arranged such that the long sides of the four electromagnetic wave emitting ports are parallel to the closest side among four sides of the dielectric top plate forming the quadrangular shape, and the long sides of the electromagnetic wave emitting ports of which the long sides are oriented in the same direction do not overlap each other in the same direction.

Effect of the Invention

The present disclosure provides a technology capable of eliminating interference of electromagnetic waves emitted from a plurality of electromagnetic wave emitting ports with each electromagnetic wave emitting port.

BRIEF DESCRIPTION OF THE DRAWINGS

FIG. 4 is a diagram showing electromagnetic field vectors of microwaves emitted from the electromagnetic wave emitting port according to an embodiment.

FIG. 5 is an S matrix showing the interference degree of the microwaves emitted from the electromagnetic wave emitting port according to an embodiment.

FIG. 9 is a diagram showing an example of the simulation result of phases of microwaves emitted from the electromagnetic wave emitting port and electric field distribution in plasma according to an embodiment.

DETAILED DESCRIPTION

Figure 1:
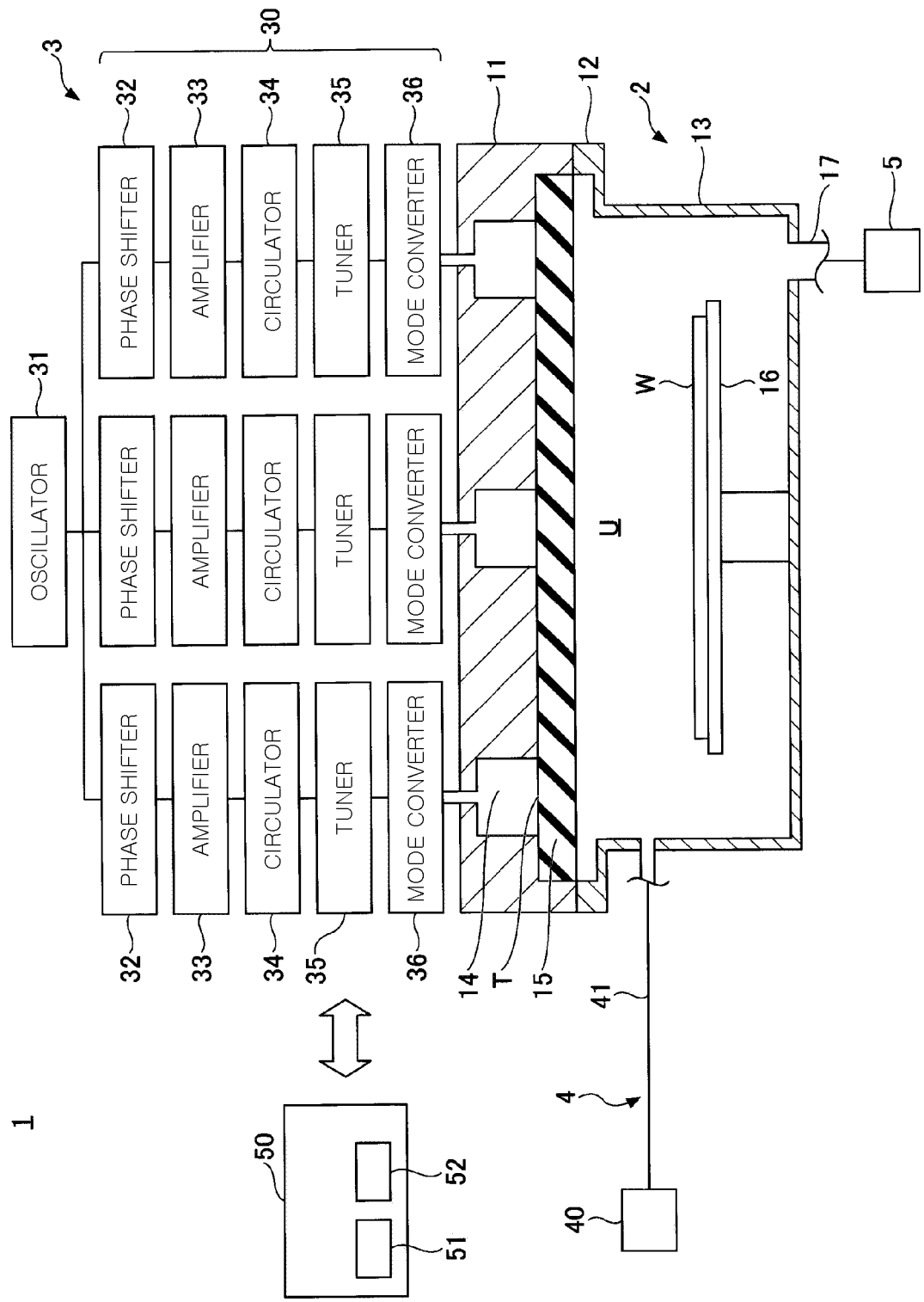
FIG. 1 is a schematic sectional view showing a microwave plasma processing apparatus according to an embodiment.

Hereinafter, exemplary embodiments of the present disclosure will be described with reference to the accompanying drawings. Further, the same reference numerals are used throughout the drawings to designate the same or similar components.

[Microwave Plasma Processing Apparatus]

First, the schematic configuration of a microwave plasma processing apparatus 1, which is an example of a plasma processing apparatus of the present disclosure, will be described with reference to FIG. 1. FIG. 1 is a schematic sectional view showing the microwave plasma processing apparatus 1 according to an embodiment. The microwave plasma processing apparatus 1 forms a desired film on a semiconductor wafer W (hereinafter simply referred to as a "substrate" or "wafer"), which is an example of a substrate to be processed, using plasma generated by microwaves.

The microwave plasma processing apparatus 1 includes a processing container (vacuum container) 2 that accommodates the substrate W, a microwave introduction device 3 that introduces microwaves into the processing container 2, a gas supply part 4 that supplies gas into the processing container 2, and an exhaust device 5 that evacuates the interior of the processing container 2 under reduced pressure. The microwave plasma processing apparatus 1 further includes a control part 50 that controls each component of the microwave plasma processing apparatus 1.

The processing container 2 is formed of a metal material, such as aluminum, aluminum alloy, or stainless steel. The upper portion of the processing container 2 is open, and an upper opening is closed by a dielectric top plate 15. The dielectric top plate 15 is formed of a dielectric such as alumina ($Al_2O_3$). The dielectric top plate 15 is fitted into a recess formed in the lower surface of a conductor plate 11 to be supported from the side of the conductor plate 11. Thereby, an internal space U of the processing container 2 is kept airtight. The conductor plate 11 for supporting the dielectric top plate 15 may be an integral structure, or may be a structure in which several parts are combined. A substrate support part 16 for supporting the substrate W is disposed in the processing container 2. The upper portion of the processing container 2 just below the dielectric top plate 15 is a rectangular parallelepiped, and the lower portion of the processing container 2 is cylindrical. Hereinafter, a portion above a stepped portion of the processing container 2 will be referred to as a first portion 12 of the processing container 2, while a portion below the stepped portion of the processing container 2 will be referred to as a second portion 13 of the processing container 2.

The conductor plate 11 is formed of a metal material, e.g., aluminum, aluminum alloy, and stainless steel. A waveguide 14 having a rectangular cross-section is formed in the conductor plate 11. Although three waveguides 14 are shown in FIG. 1, four waveguides 14 are formed in the conductor plate 11.

A lower end of the waveguide 14 is a slot-shaped electromagnetic wave emitting port T that is open to the dielectric top plate 15. The microwave introduction device 3 is provided above the conductor plate 11 on the processing container 2, and introduces microwaves (electromagnetic waves) from the microwave introduction device 3 into the processing container 2 through the electromagnetic wave emitting port T.

The microwave introduction device 3 has four microwave units 30 (three shown in FIG. 1) that introduce microwaves into the processing container 2, and an oscillator 31 that is connected to the four microwave units 30. The oscillator 31 outputs microwaves for generating plasma from gas in the processing container 2 so as to process the substrate W.

The microwaves output from the oscillator 31 are branched into four portions and then propagated by four microwave units 30. All four microwave units 30 have the same configuration. Therefore, the configuration of one microwave unit 30 will be described below. The microwave unit 30 has a phase shifter 32, an amplifier 33, a circulator 34, a tuner 35, and a mode converter 36 provided in the middle of the waveguide. The phase shifter 32, the amplifier 33, the circulator 34, and the tuner 35 are provided in this order from the upper end of the waveguide.

The phase shifter 32 controls the phase of microwave that is output from the oscillator 31. The electric field distribution of the plasma generated in a processing space U may be controlled by the electric field energy of the phase-controlled microwave.

The amplifier 33 amplifies the power of the microwave that is output from the phase shifter 32. The circulator 34 constitutes an isolator that separates a reflected wave from the processing container 2. That is, the circulator 34 guides the reflected wave from the processing container 2 to a dummy load (not shown) to separate the reflected wave therefrom.

The tuner 35 matches impedance between the oscillator 31 and the processing container 2. Impedance matching by the tuner 35 is performed based on the detection result of the reflected wave from a load side (plasma side) in a detector (not shown).

The mode converter 36 converts the mode of the microwave into a specific mode, and emits the microwave in the specific mode. The specific mode is a mode in which a mode jump is unlikely to occur, and maintains a stable plasma state. The microwave converted into the specific mode propagates through the waveguide 14 formed in the conductor plate 11, and is emitted from the electromagnetic wave emitting port T to the dielectric top plate 15. The microwave passes through the dielectric top plate 15 and then is introduced into the processing container 2.

The microwave plasma processing apparatus 1 further has the gas supply part 4 that supplies gas into the processing container 2. The gas supply part 4 includes a gas supply source 40 and a gas supply line 41. A processing gas supplied from the gas supply source 40 is supplied from the sidewall of the processing container 2 to the processing space U through the gas supply line 41. The processing gas is turned into plasma by the microwave introduced into the processing container 2 from the microwave introduction device 3. Thus, plasma processing, such as desired film formation, is performed on the circular substrate W within the processing container 2.

An exhaust pipe 17 is connected to an exhaust port provided in the bottom of the processing container 2, and the exhaust device 5 is connected to the exhaust pipe 17. The exhaust device 5 has a vacuum pump such as a dry pump. By operating the vacuum pump of the exhaust device 5, the processing space U is evacuated under reduced pressure.

Each component of the microwave plasma processing apparatus 1 is connected to the control part 50 and controlled by the control part 50. The control part 50 is typically a computer. The control part 50 includes a controller 51 having a CPU and a storage part 52 connected to the controller 51. The storage part 52 stores a control program (software) for realizing various types of processes such as plasma processing executed in the microwave plasma processing apparatus 1 under the control of the controller 51 or a recipe in which process condition data is recorded.

[Arrangement of Electromagnetic Wave Emitting Port T]

Figure 2A:
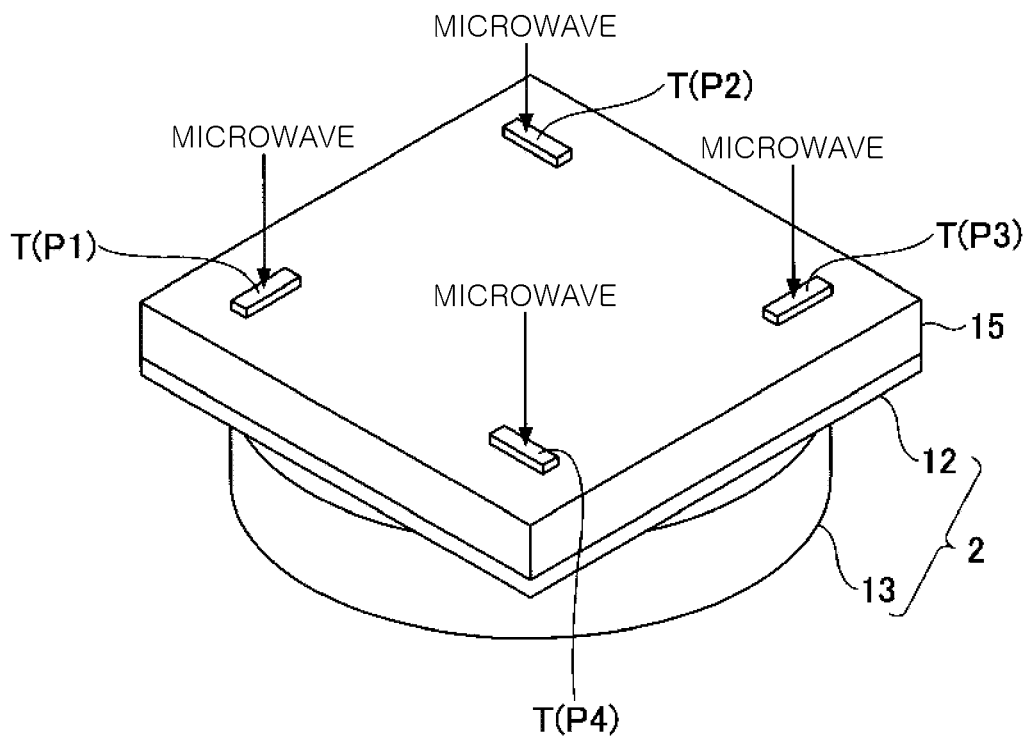
FIG. 2A is a schematic perspective view showing the configuration of a processing container and an electromagnetic wave emitting port according to an embodiment.
Figure 2B:
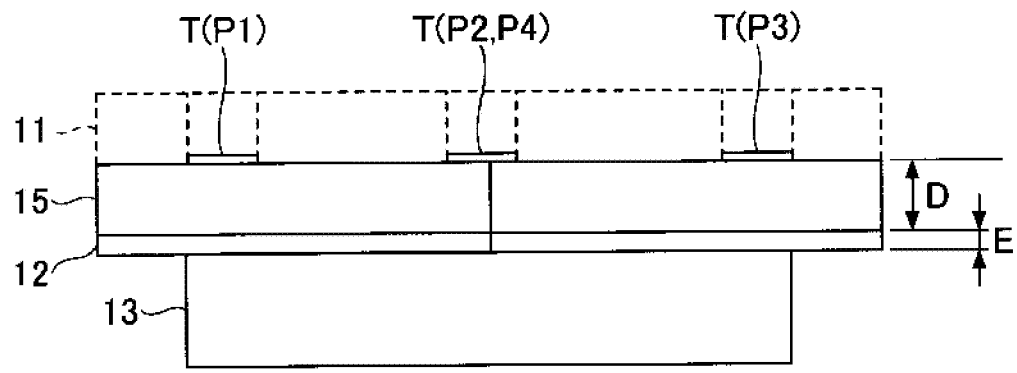
FIG. 2B is a side view showing the processing container and the electromagnetic wave emitting port according to an embodiment.

Next, the arrangement of the electromagnetic wave emitting port T will be described with reference to FIGS. 2A and 2B. FIG. 2A is a schematic perspective view showing the processing container 2 and the electromagnetic wave emitting port T according to an embodiment. FIG. 2B is a side view showing the processing container 2 and the electromagnetic wave emitting port T according to an embodiment. For the convenience of description, FIGS. 2A and 2B do not illustrate the conductor plate 11 that covers the side and upper portions of the dielectric top plate 15. Actually, as shown by the dotted lines in FIG. 2B, the dielectric top plate 15 is covered with the metal of the conductor plate 11, and four electromagnetic wave emitting ports T are opened toward the dielectric top plate 15.

As shown in FIG. 2A, the dielectric top plate 15 is quadrangular in a plan view. The shape of the inner wall of the processing container 2 in a plan view differs between the first portion 12 directly below the dielectric top plate 15 and the second portion 13. As for the shape of the inner wall of the processing container 2 in the plan view, the first portion 12 is quadrangular, and the second portion 13 is circular. In the example of FIG. 2A, the shape of the inner wall of the first portion 12 in the plan view is the same as that of the dielectric top plate 15 in the plan view. However, without being limited thereto, the shape of the inner wall of the first portion 12 in the plan view may be smaller than that of the dielectric top plate 15 in the plan view. Each of four sides of the first portion 12 in the plan view is parallel to each of four sides of the dielectric top plate 15 in the plan view. The substrate W is arranged in a space inside the second portion 13 of the processing container 2, and has a shape (circular shape) similar to that of the inner wall of the second portion 13 in the plan view.

The electromagnetic wave emitting port T is a rectangle having long sides and short sides in the plan view, and four electromagnetic wave emitting ports are present. The four electromagnetic wave emitting ports T have the same shape. The microwave is guided from the oscillator 31 to the four electromagnetic wave emitting ports T through the microwave unit 30 including four phase shifters 32 corresponding to the electromagnetic wave emitting ports, respectively. The four electromagnetic wave emitting ports T are composed of four ports for propagating the microwave to the dielectric top plate 15. In the following, the four electromagnetic wave emitting ports T include the electromagnetic wave emitting port T(P1) of a port 1, the electromagnetic wave emitting port T(P2) of a port 2, the electromagnetic wave emitting port T(P3) of a port 3, and the electromagnetic wave emitting port T(P4) of a port 4.

The four electromagnetic wave emitting ports T are arranged such that the long side of each electromagnetic wave emitting port T is parallel to the closest side among the four sides of the dielectric top plate 15, and the long sides of the electromagnetic wave emitting ports T having the long sides in the same direction are configured so as not to overlap each other in the same direction.

The dielectric top plate 15 in the plan view will be described in detail with reference to FIG. 3. The long side of the electromagnetic wave emitting port T(P1) of the port 1 is arranged to be parallel to a side 15a to which the long side of the electromagnetic wave emitting port T(P1) is closest among four sides 15a to 15d of the dielectric top plate 15. The electromagnetic wave emitting port T(P2) of the port 2 is arranged to be parallel to a side 15b to which the long side thereof is closest. The electromagnetic wave emitting port T(P3) of the port 3 is arranged to be parallel to a side 15c to which the long side thereof is closest. The electromagnetic wave emitting port T(P4) of the port 4 is arranged to be parallel to a side 15d to which the long side thereof is closest.

In addition, the long sides of the electromagnetic wave emitting port T(P1) and the electromagnetic wave emitting port T(P3) whose long sides are in the same direction (X direction) do not overlap in the X direction. In other words, a distance XD in the X direction between the right end of the electromagnetic wave emitting port T(P1) and the left end of the electromagnetic wave emitting port T(P3) is greater than zero. Similarly, the long sides of the electromagnetic wave emitting port T(P2) and the electromagnetic wave emitting port T(P4) whose long sides are in the same direction (Y direction) do not overlap in the Y direction. In other words, a distance in the Y direction between the lower end of the electromagnetic wave emitting port T(P2) and the upper end of the electromagnetic wave emitting port T(P4) is greater than zero.

Further, the long side directions of neighboring electromagnetic wave emitting ports T among the four electromagnetic wave emitting ports T are perpendicular to each other. The long side directions of the electromagnetic wave emitting port T(P1) of the port 1 and neighboring electromagnetic wave emitting ports T(P2) and T(P4) are perpendicular to each other. The long side directions of the electromagnetic wave emitting port T(P2) of the port 2 and neighboring electromagnetic wave emitting ports T(P1) and T(P3) are perpendicular to each other. The same is true for others.

[Arrangement and Interference of Electromagnetic Wave Emitting Port T]

In order to form a high-quality film, it is preferable to generate high-density radicals. In order to generate the high-density radicals, it is effective to (1) narrow a gap between the substrate support part 16 and the dielectric top plate 15, and (2) use high-frequency energy for plasma generation, and it is preferable to use a microwave band in frequency as in the present disclosure. However, the microwave has a short wavelength, a standing wave is generated in the dielectric top plate 15, the electric field energy becomes stronger at the antinode of the standing wave, and the electric field energy becomes weaker at the node of the standing wave. For this reason, the strength and weakness of the electric field in an electric field diffusion part directly under the dielectric top plate 15 (e.g., the electromagnetic field vector 100 of the microwave in the electric field diffusion part emitted from below the electromagnetic wave emitting port T in FIG. 4) is generated, and it becomes difficult to obtain a uniform plasma distribution in the plasma space near the electric field diffusion part. Therefore, if the gap between the substrate support part 16 and the dielectric top plate 15 is narrowed, the uniformity of the plasma deteriorates, so it is difficult to narrow the gap. Thus, according to the present disclosure, there is proposed a method of obtaining uniform plasma even when the gap is narrowed by controlling the distribution of microwaves through a phase control by the phase shifter 32.

Specifically, the microwave plasma processing apparatus 1 has a slot antenna having the four electromagnetic wave emitting ports T, a rectangular parallelepiped dielectric top plate 15, and a vacuum processing container 2, and microwaves are simultaneously incident from the four electromagnetic wave emitting ports T onto the dielectric top plate 15. Microwaves are synthesized in the dielectric top plate 15 to create a desired standing wave pattern (electric field pattern) of the microwaves inside the dielectric top plate 15. Various electric field patterns may be created inside the dielectric top plate 15 by changing the phases of the microwaves incident from the four electromagnetic wave emitting ports T. In addition, according to the present disclosure, since microwaves are synthesized in the dielectric top plate 15, the wavelength of the microwaves can be shortened, standing waves can be easily formed in the dielectric top plate 15, and it is possible to precisely control electric field distribution. Further, since the microwaves are synthesized in the dielectric top plate 15, microwaves incident from the four electromagnetic wave emitting ports T may be reflected at only one place (a boundary between the dielectric top plate 15 and the processing space U). The electric field pattern formed in the dielectric top plate 15 is obtained by time-averaging the standing waves of the microwaves, and plasma generated under the dielectric top plate 15, i.e., under the standing wave is finally uniformed from the obtained time-averaged electric field pattern. In other words, the standing wave is intentionally generated in the dielectric top plate 15, and the position of the standing wave (i.e. the position of the antinode and the node) is shifted with time by changing the phase of the electromagnetic waves emitted from the four electromagnetic wave emitting ports T with the passage of time, thus achieving the in-plane uniformity of the plasma processing on the substrate W.

In this case, interference between the slot antennas indicated by the four electromagnetic wave emitting ports T may pose a problem. The term "interference" means that electromagnetic waves emitted from one slot antenna are introduced into another slot antenna. If there is interference between the four electromagnetic wave emitting ports T of the microwave, the microwave itself is not be absorbed by the plasma and is wasted. Therefore, it is important to eliminate mutual interference between the slot antennas.

When the electromagnetic wave interference occurs, it is impossible to achieve impedance matching for a specific antenna, and the total power corresponding to the number of antennas may be maximally introduced into the specific antenna. The power introduced into the specific antenna as reflected power is usually assumed to be twice the maximum power of the specific antenna (total reflection). When the interference power is introduced, there is a risk of causing damage to the apparatus. Thus, according to the present disclosure, by utilizing the emission directivity of the slot antenna shown as the four electromagnetic wave emitting ports T, the four electromagnetic wave emitting ports T are designed so that there is no electromagnetic wave interference. In order to eliminate the interference between the slot antennas, the arrangement of the four electromagnetic wave emitting ports T, a positional relationship between the four electromagnetic wave emitting ports T and the dielectric top plate 15, the shape of the dielectric top plate 15, and the shape of the processing container 2, and a connection dimension between the dielectric top plate 15 and the processing container 2 are important.

Therefore, the microwave plasma processing apparatus 1 according to the present disclosure has a structure having the four electromagnetic wave emitting ports T arranged so that the long side directions of the slot antennas are perpendicular to each other so as to prevent interference due to the electromagnetic waves introduced into the antennas.

In addition, the microwave plasma processing apparatus 1 according to the present disclosure has a structure having the rectangular parallelepiped dielectric top plate 15 with sides parallel to or perpendicular to the four slot antennas. Further, in this structure, the first portion 12 of the rectangular parallelepiped processing container 2 that is the same as or smaller than the dielectric top plate 15 is arranged directly under the dielectric top plate 15. This eliminates interference between the four slot antennas and improves the utilization efficiency of the supplied power. The arrangement and interference of the electromagnetic wave emitting ports T functioning as the slot antenna that emits the microwaves will be described below with reference to FIG. 3.

Figure 3:
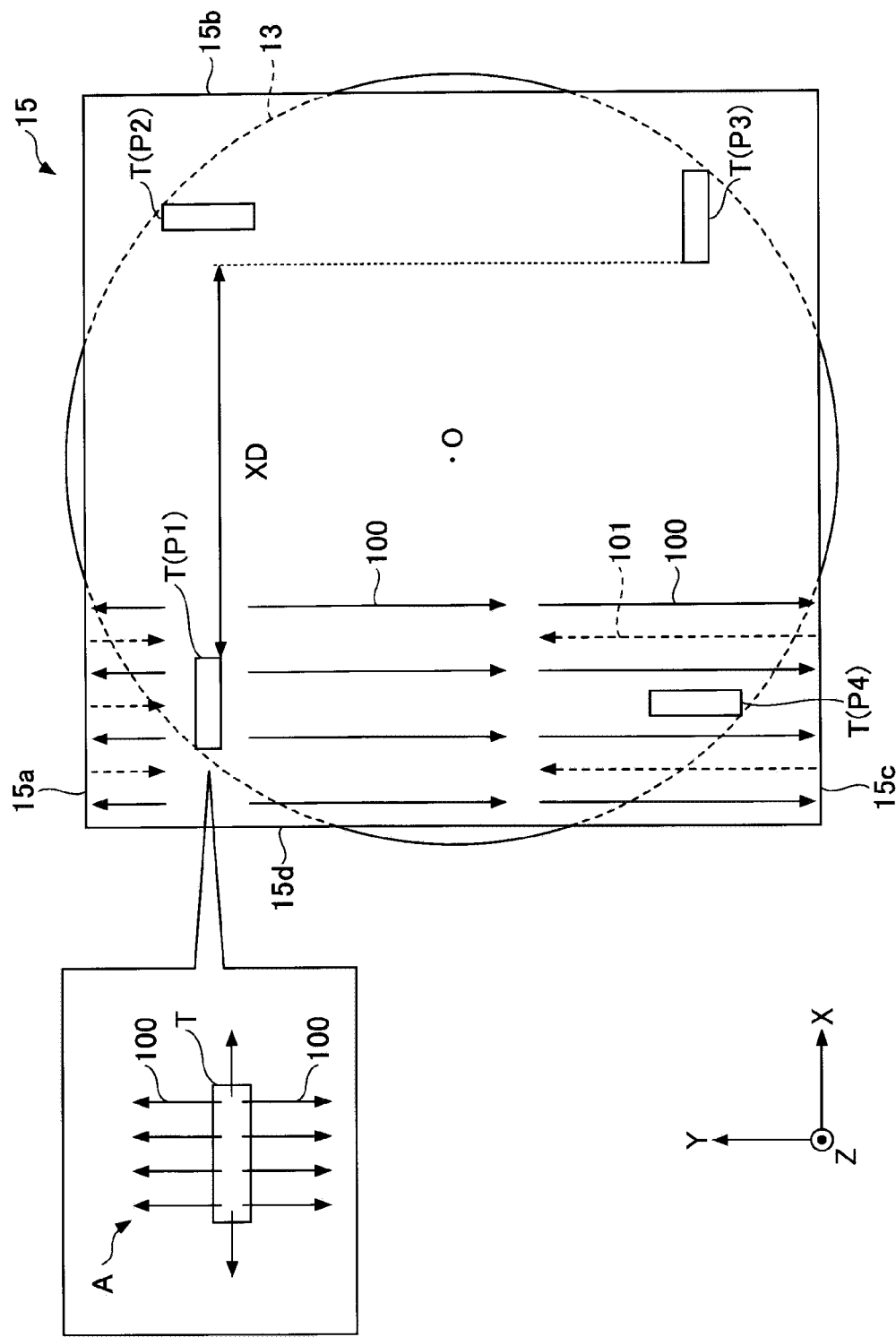
FIG. 3 is a diagram showing electromagnetic field vectors of microwaves emitted from the electromagnetic wave emitting port according to an embodiment.

Reference character O in FIG. 3 denotes the center of the substrate W and the second portion 13 of the processing container 2, and is also common to the center of the dielectric top plate 15 in the present disclosure. Further, the center of the substrate W and the center of the dielectric top plate 15 may not necessarily overlap.

As shown in FIG. 3, in the present disclosure, the electromagnetic wave emitting ports T(P1) to T(P4) are arranged at four-fold symmetrical positions around a Z-axis passing through reference character O. Here, "n-fold symmetry" is a group of symmetries that characterize a figure, where n is an integer of 2 or more, and the n-fold symmetry is the property of overlapping itself when rotated (360°/n) around the Z axis. In other words, the electromagnetic wave emitting ports T(P1) to T(P4) are arranged at positions overlapping themselves when rotated 90° (=360°/4) around reference character O.

The ratio of a length in the long side direction to a length in the short side direction of the four electromagnetic wave emitting ports T(P1) to T(P4) is preferably 3.5 to 4.0. With this ratio, the directivity of the microwaves emitted from the electromagnetic wave emitting ports T(P1) to T(P4) into the processing container 2 may be strengthened in a direction perpendicular to the long sides (direction parallel to the short sides) of the electromagnetic wave emitting ports T(P1) to T(P4). In other words, when the ratio of the length in the long side direction to the length in the short side direction of the electromagnetic wave emitting ports T(P1) to T(P4) is less than 3.5 to 4.0, the microwaves emitted from each electromagnetic wave emitting port T into the processing container 2 are likely to be directed in a direction parallel to the long side of the electromagnetic wave emitting port T.

Portion "A" of FIG. 3 is an enlarged plan view showing one electromagnetic wave emitting port T. As indicated by the arrow length in "A" of FIG. 3, the electromagnetic field vector 100, which indicates the dominant directivity of microwaves in the electromagnetic wave emitting port T, is perpendicular to the long side. Therefore, as indicated by the electromagnetic field vector 100 of the microwave emitted from the electromagnetic wave emitting port T(P1), as a representative example of FIG. 3, among the electromagnetic wave emitting ports T(P1) to T(P4), the electromagnetic field vector 100 indicating the dominant directivity is directed toward sides 15a and 15c as shown by solid arrows.

In this way, for example, most of the microwaves emitted from the electromagnetic wave emitting port T(P1) travel in a direction perpendicular to the long side, and are reflected in opposite directions from the two sides 15a and 15c. The sides 15a and 15c are provided to be parallel to the long side of the electromagnetic wave emitting port T(P1). Therefore, the electromagnetic field vector 101 indicating the directivity of the reflected wave of the electromagnetic field vector 100 becomes opposite in direction to the electromagnetic field vector 100 indicating the directivity of the travelling wave, and rarely scatters in a direction toward the electromagnetic wave emitting ports T(P2) and T(P4). Further, the long sides of the electromagnetic wave emitting port T(P1) and the electromagnetic wave emitting port T(P3) do not overlap in the same direction. In other words, the distance XD is greater than 0. Therefore, the electromagnetic field vector 100 generated by the long side of the electromagnetic wave emitting port T(P1) and the electromagnetic field vector 101 indicating the directivity of the reflected wave rarely scatter in a direction toward the electromagnetic wave emitting port T(P3). With such a configuration, it is possible to avoid mutual interference of microwaves that are output from the four electromagnetic wave emitting ports T(P1) to T(P4). That is, according to the present disclosure, the shape and arrangement of the four electromagnetic wave emitting ports T(P1) to T(P4) shown in FIG. 3, the shape of the dielectric top plate 15, and the positions of the four sides 15a to 15d are combined, so that it is possible to prevent the travelling wave or the reflected wave of the microwave having the directivity and emitted from one electromagnetic wave emitting port T from entering another electromagnetic wave emitting port T, that is, from interfering with each other, and to enhance the utilization efficiency of the microwave power supply.

Although the electromagnetic wave emitting port T(P1) has been described as an example, the electromagnetic wave emitting ports T(P2), T(P3), and T(P4) are arranged so that the relationship is established between the electromagnetic wave emitting port T and each of the sides 15a to 15d of the dielectric top plate 15.

[S Matrix]

Next, the analysis result of the S matrix for the four electromagnetic wave emitting ports T(P1) to T(P4) arranged as described above will be described with reference to FIG. 5. FIG. 5 shows an example of an S-matrix expression indicating the degree of interference of microwaves emitted from the electromagnetic wave emitting ports T(P1) to T(P4) according to an embodiment.

In the S matrix, a preceding subscript x of $S_{xy}$ indicates an output port (electromagnetic wave emitting port T at an output destination), and a subsequent number y indicates an input port (electromagnetic wave emitting port T at an input source). For example, $S_{11}$ shows the characteristics of how much the electromagnetic waves are reflected back toward the electromagnetic wave emitting port T(P1) when a signal is input from the electromagnetic wave emitting port T(P1) and nothing is input from the electromagnetic wave emitting ports T(P2) to T(P4). In other words, $S_{11}$ shows the characteristics of the reflected wave (electromagnetic field vector 101) of the microwave reflected to the electromagnetic wave emitting port T(P1) with respect to the traveling wave (electromagnetic field vector 100) of the microwave input from the electromagnetic wave emitting port T(P1). Similarly, $S_{12}$ shows the characteristics of how much the electromagnetic waves are output to the electromagnetic wave emitting port T(P1) when nothing is input from the electromagnetic wave emitting ports T(P1), T(P3), and T(P4) and a signal is input from the electromagnetic wave emitting port T(P2).

$a_1$ to $a_4$ and $b_1$ to $b_4$ are power vectors. $a_1$, $a_2$, $a_3$ and $a_4$ are power vectors of microwaves that are input to four ports of the electromagnetic wave emitting ports T(P1) to T(P4). $b_1$, $b_2$, $b_3$ and $b_4$ are power vectors of microwaves that are output from the four ports of the electromagnetic wave emitting ports T(P1) to T(P4). For example, $a_1$ is the power vector of the microwave input from the electromagnetic wave emitting port T(P1). $b_1$ is the power vector of the microwave output from the electromagnetic wave emitting port T(P1). The S parameter is a complex number, and $a_1$ to $a_4$ and $b_1$ to $b_4$ are also expressed by complex numbers.

For example, the power vector $b_1$ of the microwave output from the electromagnetic wave emitting port T(P1) may be calculated by the following equation.

$$b_1 = S_{11} \times a_1 + S_{12} \times a_2 + S_{13} \times a_3 + S_{14} \times a_4$$

As described above, "interference" means that a portion of microwaves input from one electromagnetic wave emitting port T is output from another electromagnetic wave emitting port T. For example, when the value of $b_1$ includes at least one term of $a_2$, $a_3$, and $a_4$, the interference may occur between the electromagnetic wave emitting port T(P1) and at least one of the electromagnetic wave emitting ports T(P2) to T(P4). Therefore, when there is no interference between the electromagnetic wave emitting port T(P1) and the electromagnetic wave emitting ports T(P2) to T(P4), the terms of $a_2$, $a_3$, and $a_4$ are not included in the value of $b_1$. In other words, if $S_{12}$, $S_{13}$ and $S_{14}$ are 0, $b_1 = S_{11} \times a_1$ and there is no interference. Therefore, when parameters $S_{ij}(i \neq j)$ other than the diagonal components ($S_{11}$, $S_{22}$, $S_{33}$, $S_{44}$) of the S matrix in FIG. 5 are equal to or smaller than 0, it can be seen that there is no interference between the four electromagnetic wave emitting ports T(P1) to T(P4). Further, the absolute value of the square of the power vector becomes the power of the microwave. Therefore, the interference affects the decrease in the utilization efficiency of the microwave supply power by the square of the S parameter.

Therefore, it is important to eliminate interference between the electromagnetic wave emitting ports T(P1) to T(P4) in order to effectively utilize the supplied power. The electromagnetic wave emitting ports T(P1) to T(P4) may be arranged in four-fold symmetry, and the S matrix on the first row of FIG. 5 may replace S parameters on both sides of the diagonal component with the same parameter as shown in the S matrix on the second row due to the symmetry of a system in which the electromagnetic wave emitting ports T(P1) to T(P4) are arranged. For example, $S_{21}$ may be replaced with $S_{12}$, $S_{31}$ may be replaced with $S_{13}$, $S_{32}$ may be replaced with $S_{23}$, $S_{41}$ may be replaced with $S_{14}$, $S_{42}$ may be replaced with $S_{24}$, and $S_{43}$ may be replaced with $S_{34}$.

Further, the parameters $S_{ii}$ ($S_{11}$, $S_{22}$, $S_{33}$, $S_{44}$) of the diagonal components of the S matrix preferably have small values, and are preferably 0.2 or less, for example. However, they may be larger than the parameters $S_{ij}$ other than the diagonal components of the S matrix. In this case, tuning may be performed to reduce the interference component of the diagonal components.

An example of the analysis result of the S matrix is shown in the S matrix on the third row of FIG. 5 in relation to the simulation result of the interference of the electromagnetic wave emitting ports T(P1) to T(P4) when the microwave of 860 MHz is emitted from the oscillator 31 of the microwave plasma processing apparatus 1 of FIG. 1. In this example, the values of the diagonal component parameters $S_{ii}$ ($S_{11}$, $S_{22}$, $S_{33}$, $S_{44}$) are less than 0.2. Further, the parameter Sid other than the diagonal components is 0.08 or less. In particular, the parameter Sid other than the diagonal components has a value smaller than 0.1, indicating that almost no interference occurs.

[Shape of Processing Container]

Next, the shape and interference of the processing container 2 will be described. The inner wall of the second portion 13 of the processing container 2 is circular. If the rectangular dielectric top plate 15 is directly placed on the circular processing container 2, the S parameter deteriorates and the interference increases.

As shown in FIG. 3, most of the microwaves emitted from the electromagnetic wave emitting port T(P1) travel in a direction perpendicular to the long side, and are reflected by the two sides 15a and 15c in a direction opposite to the travel direction. The sides 15a and 15c are provided to be parallel to the long side of the electromagnetic wave emitting port T(P1). Therefore, the electromagnetic field vector 101 indicating the directivity of the reflected wave of the electromagnetic field vector 100 becomes opposite in direction to the electromagnetic field vector 100 indicating the directivity of the travelling wave, and rarely scatters in a direction toward the electromagnetic wave emitting ports T(P2) and T(P4).

On the other hand, when the circular processing container 2 (second portion 13) is directly placed just below the dielectric top plate 15, the bottom of the dielectric top plate 15 contacts the plasma, so that a relatively large electromagnetic wave is present in the vicinity of the lower surface of the dielectric top plate 15 (e.g. several tens of millimeters). The inner wall of the circular processing container 2 is not provided parallel to the long side of the electromagnetic wave emitting port T(P1). Therefore, when the microwave propagating directly under or near the dielectric top plate 15 is reflected by the inner wall of the circular processing container 2, the direction in which the reflected wave travels is not necessarily opposite to that of the traveling wave, resulting in electromagnetic field vectors that are reflected in different directions. The electromagnetic field vectors reflected in different directions cause interference.

Therefore, the first portion 12 of the processing container 2, having a rectangular parallelepiped of the same size as the dielectric top plate 15 or a size smaller than the dielectric top plate, is provided directly below the dielectric top plate 15. As a result, most of the microwaves propagating directly under or near the dielectric top plate 15 are reflected in the direction opposite to the traveling wave, and the electromagnetic field vector 101 indicating the directivity of the reflected wave is opposite in direction to the electromagnetic field vector 100 indicating the directivity of the traveling wave. Thus, it is possible to prevent microwaves from scattering in the direction toward other electromagnetic wave emitting ports T and causing interference.

It is preferable that the thickness of the first portion 12 of the processing container 2 directly below the dielectric top plate 15 is 20 mm or more. In other words, the processing container 2 is formed in the shape of a rectangular parallelepiped up to a height of about 20 mm from directly below the dielectric top plate 15 where the plasma absorbs the electromagnetic field vector.

Figure 6:
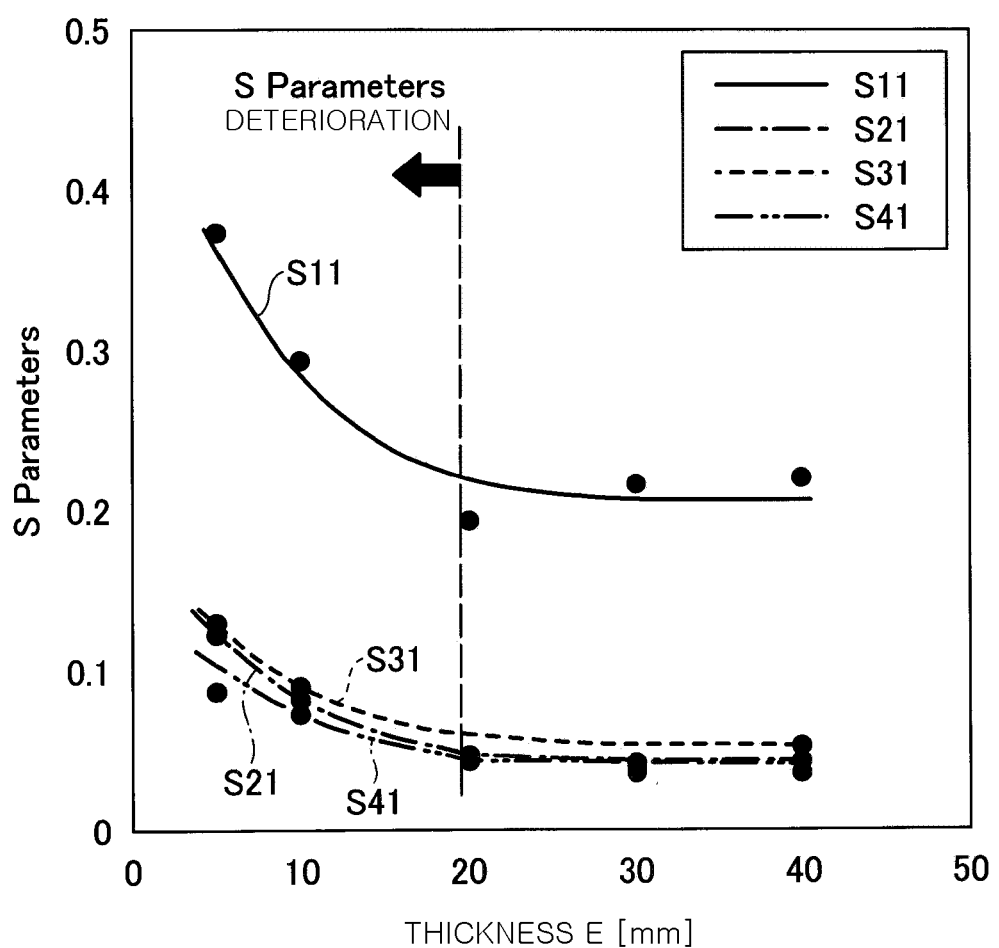
FIG. 6 is a graph showing a relationship between the thickness of a first portion of the processing container and the interference of microwaves according to an embodiment.

FIG. 6 is a simulation result graph showing an example of a relationship between the thickness of the first portion 12 of the processing container 2 and the interference of microwaves according to an embodiment. The horizontal axis in FIG. 6 indicates the thickness E of the first portion 12 (see the first portion 12 in FIG. 2B), and the vertical axis indicates the S parameter. S11 is the S parameter corresponding to the electromagnetic wave emitting port T(P1), S21 is the S parameter corresponding to the electromagnetic wave emitting port T(P2), S31 is the S parameter corresponding to the electromagnetic wave emitting port T(P3), and S41 is the S parameter corresponding to the electromagnetic wave emitting port T(P4).

From the simulation results, it can be seen that when the thickness E of the first portion 12 is less than 20 mm, the values of S11, S21, S31, and S41 increase as the thickness of the first portion 12 decreases. When the thickness of the first portion 12 is 20 mm or more, the values of S21, S31, and S41 are less than 0.1 and are about 0.05, and the value of S11 is about 0.2. From the above, it can be seen that the interference between the electromagnetic wave emitting ports T can be substantially eliminated by setting the thickness of the first portion 12 immediately below the dielectric top plate 15 to 20 mm or more.

On the other hand, almost no electric field exists in the second portion 13 of the processing container 2. Therefore, the second portion 13 of the processing container 2 does not have to be a rectangular parallelepiped. The substrate W is plasma-processed in the second portion 13 of the processing container 2. Therefore, considering the symmetry of the gas flow and the controllability of the plasma in order to uniformly process the substrate W, the inner wall of the second portion 13 of the processing container 2 has the same circular shape as the substrate W, and is preferably arranged concentrically with respect to the substrate W. However, the inner wall of the second portion 13 in the plan view may not be circular, and may be quadrangular like the first portion 12, for example.

[Thickness of Dielectric Top Plate]

In the microwave plasma processing apparatus 1 of the present disclosure, four phase-controlled electromagnetic waves are simultaneously incident from four electromagnetic wave emitting ports T(P1) to T(P4), and four microwaves are synthesized within the dielectric top plate 15. Therefore, the thickness of the dielectric top plate 15 changes the S parameter, and is related to the presence or absence of interference between the electromagnetic wave emitting ports T.

Figure 7:
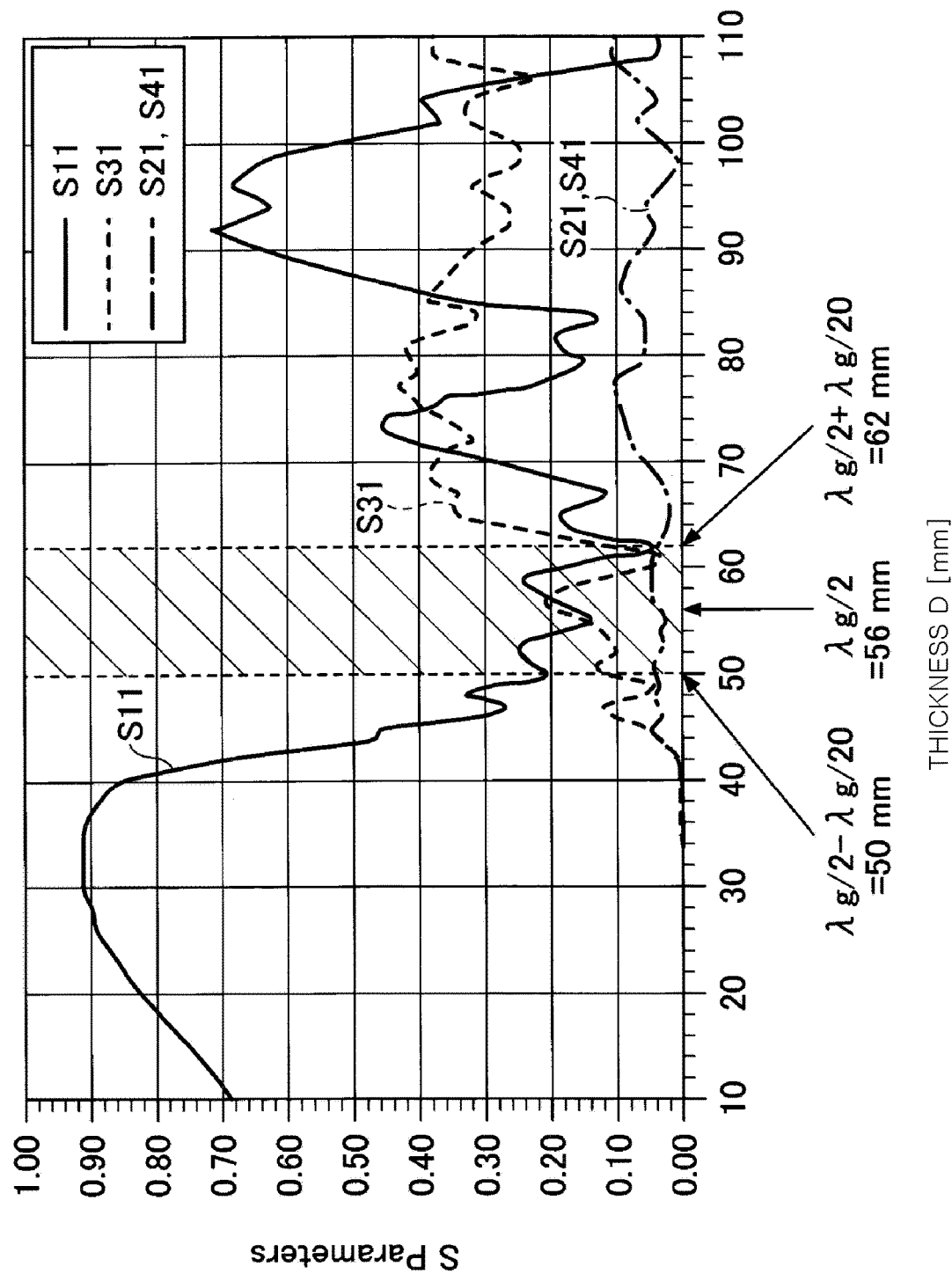
FIG. 7 is a graph showing a relationship between the thickness of a dielectric top plate and the interference of microwaves according to an embodiment.

FIG. 7 is a simulation result graph showing an example of a relationship between the thickness of the dielectric top plate 15 and the interference of microwaves according to an embodiment. It is a simulation result when the microwave of 860 MHz is emitted from the oscillator 31 of the microwave plasma processing apparatus 1 of FIG. 1. The horizontal axis of FIG. 7 indicates the thickness D of the dielectric top plate 15 (see FIG. 2A), and the vertical axis indicates the S parameter.

The thickness D at which all S parameter values of S11, S21, S31, and S41 are small is the thickness of the dielectric top plate 15 at which almost no interference occurs. From the simulation results of FIG. 7, the thickness D of the dielectric top plate 15 that is appropriate for preventing interference becomes the effective wavelength $\lambda g/2 \pm \lambda g/20$ of the incident electromagnetic wave (microwave) incident from the electromagnetic wave emitting port T. Also, the effective wavelength $\lambda g$ may be calculated from the following equation (1).

$$\lambda g = \lambda_0 / \sqrt{\varepsilon_r} \qquad (1)$$

In equation (1), a free space wavelength is $\lambda_0$, and the relative dielectric constant of the dielectric top plate 15 is $\varepsilon_r$. The free space wavelength $\lambda_0$ is the wavelength of incident electromagnetic waves when a dielectric with the relative dielectric constant of 1 is placed in the free space. From equation (1), the effective wavelength $\lambda g$ of the incident electromagnetic waves is about 50 mm to about 62 mm when alumina having the relative dielectric constant $\varepsilon_r$ of 9.8 is used for the dielectric top plate 15. In other words, when the thickness D of the dielectric top plate 15 is in the range of about 50 mm to about 62 mm, which is $\lambda g/2 \pm \lambda g/20$, there is little interference, and the thickness of 56 mm has the least interference, which is a preferable result.

Further, from the simulation result shown in the graph, it can be seen that interference between the electromagnetic wave emitting port T(P1) corresponding to $S_{11}$ and the electromagnetic wave emitting port T(P3) corresponding to $S_{31}$ occurs easily because the long sides thereof are arranged parallel to each other. On the other hand, it is difficult for the electromagnetic wave emitting port T(P2) corresponding to $S_{21}$ and the electromagnetic wave emitting port T(P4) corresponding to $S_{41}$ to interfere with the electromagnetic wave emitting port T(P1) and the electromagnetic wave emitting port T(P3) that may be handled in the same position, and $S_{21}$ and $S_{41}$ are 0.1 or less regardless of the thickness D of the dielectric top plate 15. Therefore, it is important to determine the thickness D of the dielectric top plate 15 so that interference does not occur. In other words, the thickness D of the dielectric top plate 15 is the thickness in which the values of all the S parameters $S_{11}$, $S_{21}$, $S_{31}$, and $S_{41}$ are small, that is, is preferably in the range of $\lambda g/2 \pm \lambda g/20$ with respect to the effective wavelength $\lambda g$ of the microwave.

Figure 8A:
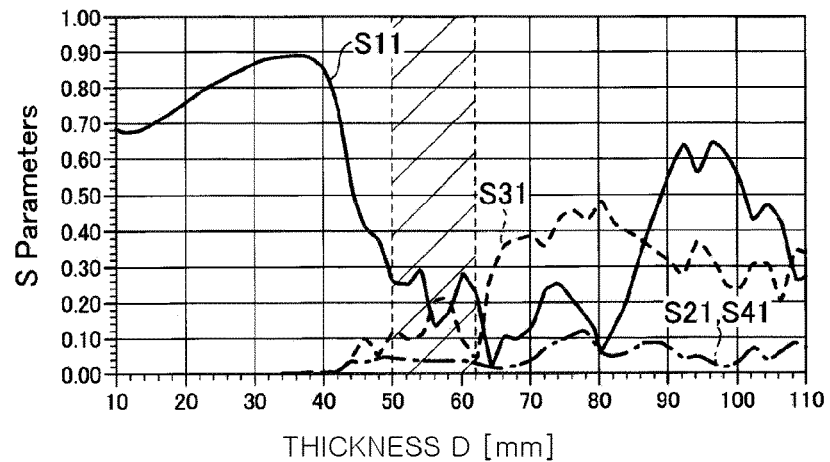
FIG. 8 is a graph showing a relationship between the length of the electromagnetic wave emitting port, the thickness of the dielectric top plate, and the interference of microwaves according to an embodiment.
Figure 8B:
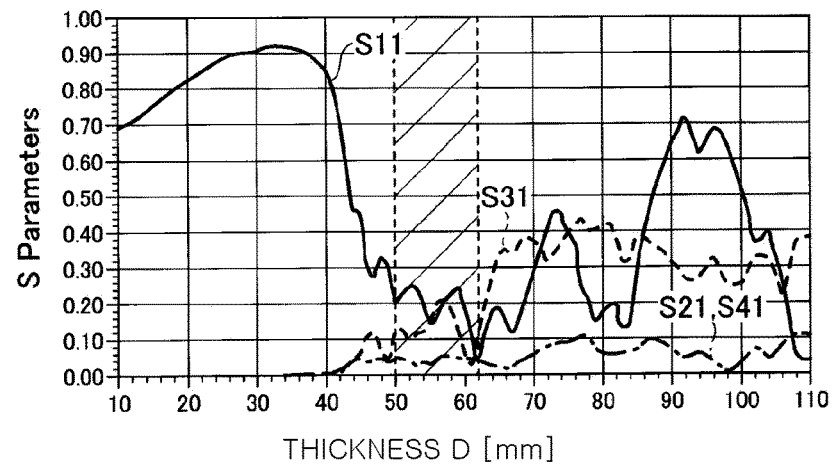
Figure 8C:
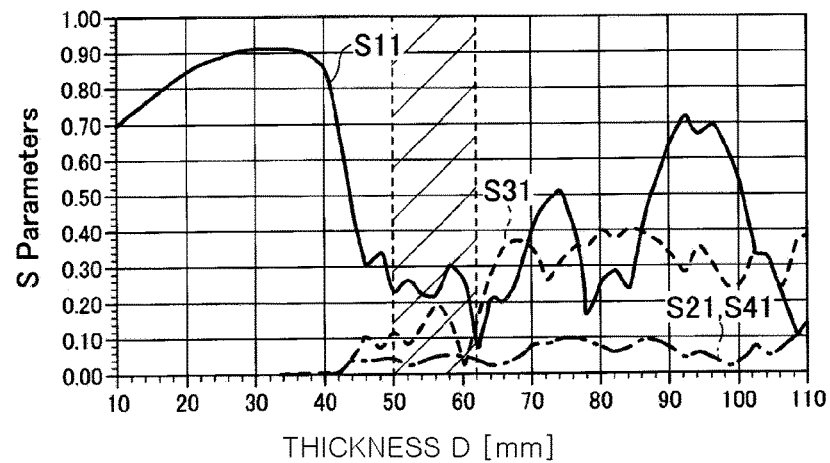

FIG. 8 is a simulation result graph showing an example of a relationship between the length of the electromagnetic wave emitting port T, the thickness of the dielectric top plate 15, and the interference of microwaves according to an embodiment. The simulation conditions are the same as the simulation conditions for obtaining the results of FIG. 7, and only the length in the long side of the electromagnetic wave emitting port T (indicated by the slot in FIG. 8) is varied as shown in FIGS. 8(a) to 8(c). As in FIG. 7, the horizontal axis of FIGS. 8(a) to 8(c) represents the thickness D of the dielectric top plate 15, and the vertical axis represents the S parameter.

As a result, the thickness D in which the values of all S parameters S11, S21, S31, and S41 are small was about 50 mm to about 62 mm when the length of the long side of the electromagnetic wave emitting port T (slot) is (a) 60 mm, (b) 70 mm, or (c) 80 mm. In other words, it can be seen that the thickness D of the dielectric top plate 15 that is appropriate for preventing interference does not depend on the length of the long side of the electromagnetic wave emitting port T (slot).

[Electric Field Distribution in Plasma]

An example of controlling the electric field distribution in the plasma will be described with reference to FIG. 9. FIG. 9 shows the electric field distribution in the plasma on the lower surface of the dielectric top plate 15 when microwaves of 500 W are emitted from each of the electromagnetic wave emitting ports T(P1) to T(P4). FIG. 9 shows an example of an electric field pattern on the lower surface of the dielectric top plate 15 when the phase of the microwave input to each of the electromagnetic wave emitting ports T(P1) to T(P4) is changed.

The electric field distribution in plasma shows a distribution with the same tendency as this electric field distribution. However, because the electric field distribution in the plasma spreads due to diffusion distribution while being restricted by the electric field distribution on the lower surface of the dielectric top plate 15, the electric field distribution is more uniform than the electric field distribution on the lower surface of the dielectric top plate 15.

As shown by P1 to P4 in FIGS. 9(a) to 9(d), the phases of the microwaves input to the respective electromagnetic wave emitting ports T(P1) to T(P4) are changed. As a result, the electric field in the plasma on the wafer shown by the dotted circle in FIG. 9 may be controlled to concentrate on the center side (FIG. 9(b)), the outer peripheral side (FIG. 9(c)), and the intermediate positions (FIGS. 9(a) and 9(d)). For example, in FIG. 9(b), the phases of the microwaves incident from the electromagnetic wave emitting ports T(P1), T(P2), T(P3), and T(P4) are controlled to 0°, 180°, 0°, and 180°, so that the electric field in the plasma on the wafer may be concentrated on the center.

As described above, the phase shifters 32 connected respectively to the electromagnetic wave emitting ports T(P1) to T(P4) freely change and optimize the phases of the microwaves emitted from the electromagnetic wave emitting ports T(P1) to T(P4). Thereby, uniform plasma may be generated under various process conditions.

Further, the simulation results of the electric field distribution shown in FIGS. 9(a) to 9(d) as an example are previously collected under a large number of process conditions, and then stored in the storage part 52 of the control part 50. As a result, in the actual process, the control part 50 freely changes the phase of the microwave incident from each of the electromagnetic wave emitting ports T(P1) to T(P4) with reference to the storage part 52, thus optimizing the phase. At this time, the control part 50 may obtain a desired electric field distribution in the plasma by performing the phase control of the microwaves incident from the electromagnetic wave emitting ports T(P1) to T(P4) so as to combine the simulation results of the electric field distribution. Further, the electric field distribution in the plasma may be monitored by a sensor, and data on the electric field distribution in the plasma may be machine learned as input data and then fed back to the phase control of each of the electromagnetic wave emitting ports T(P1) to T(P4) in real time.

[Plasma Processing Method]

Figure 10:
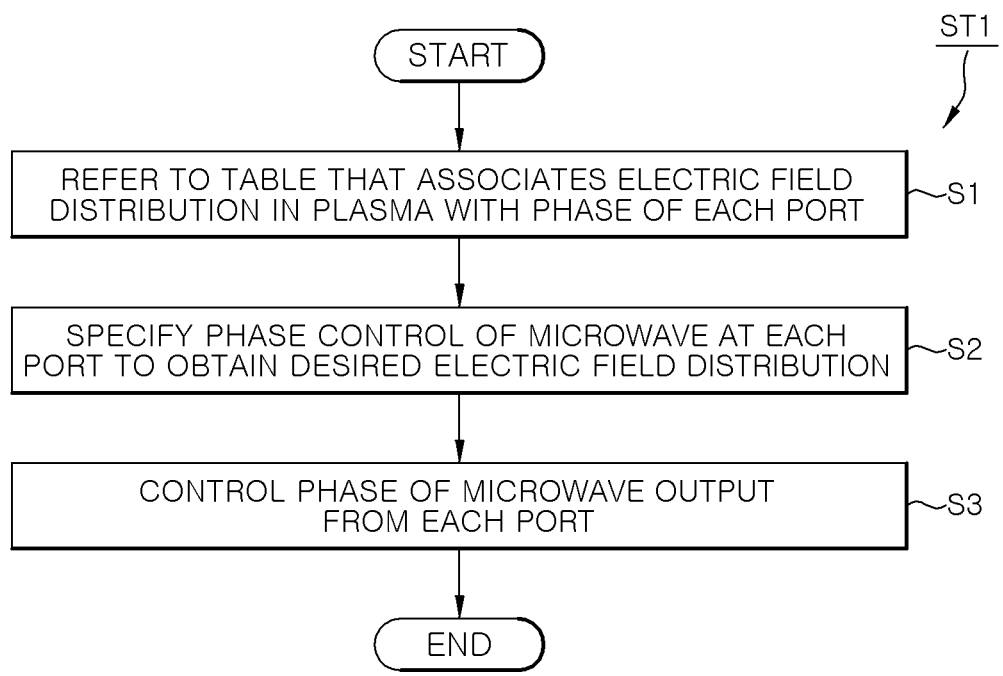
FIG. 10 is a flowchart showing an example of a plasma processing method ST1 according to an embodiment.

FIG. 10 is a flowchart showing an example of a plasma processing method ST1 according to an embodiment. Before the plasma processing method ST1 is started, a table associating the electric field distribution in the plasma with the phase of each port of the electromagnetic wave emitting ports T(P1) to T(P4) is stored in the storage part 52.

When this process is started, the control part 50 refers to the table stored in the storage part 52 (step S1), and specifies the phase control of each port of the electromagnetic wave emitting ports T(P1) to T(P4) that may obtain a desired electric field distribution in the plasma (step $S_2$). Next, the control part 50 controls the phase of the microwave output from each port to become the specified phase of each port using each phase shifter 32 (step $S_3$). Thereafter, this process is terminated.

It should be noted that steps $S_2$ and $S_3$ may be repeated to control a combination by concentrating the electric field distribution in FIG. 9 on the center side and then concentrating it on the outer peripheral side. Thus, a desired electric field distribution in the plasma can be obtained by continuously controlling the phases of the electromagnetic wave emitting ports T(P1) to T(P4).

As described above, according to the plasma processing apparatus and the plasma processing method of the present embodiment, it is possible to eliminate the interference of the electromagnetic waves emitted from the plurality of electromagnetic wave emitting ports with the respective electromagnetic wave emitting ports.

Although an embodiment has been described, it is to be understood that the embodiment is merely illustrative but is not restrictive. Various changes may be made on the above-described embodiment. In addition, the above-mentioned embodiment may be omitted, substituted, or changed in various forms without departing from the scope of the claims.

This application claims priority from Japanese Patent Application No. 2021-053311 filed on Mar. 26, 2021 with the Japan Patent Office, the entire contents of which are hereby incorporated by reference.

DESCRIPTION OF REFERENCE NUMERALS

1: microwave plasma processing apparatus
2: processing container
3: microwave introduction device
11: conductor plate
12: first portion of processing container
13: second portion of processing container
15: dielectric top plate
30: microwave unit
32: phase shifter
50: control part
T: electromagnetic wave emitting port

The invention claimed is:
1. A plasma processing apparatus comprising:
a processing container configured such that a substrate to be processed is subjected to plasma processing;
a dielectric top plate which is a quadrangular shape in a plan view and which is provided to close an upper opening of the processing container; and a conductor plate supporting the dielectric top plate and having four electromagnetic wave emitting ports configured to emit electromagnetic waves to the dielectric top plate, wherein each of the four electromagnetic wave emitting ports has a rectangular shape having a long side and a short side in a plan view, the four electromagnetic wave emitting ports are arranged such that the long side of each of the four electromagnetic wave emitting ports are parallel to a closest side among four sides of the dielectric top plate forming the quadrangular shape, and long sides of two electromagnetic wave emitting ports oriented in a same direction do not overlap each other in the same direction.

2. The plasma processing apparatus of claim 1, wherein an electromagnetic wave is guided from an oscillator to each of the four electromagnetic wave emitting ports via a phase shifter.

3. The plasma processing apparatus of claim 2, wherein a shape of an inner wall of the processing container in the plan view differs between a first portion directly below the dielectric top plate and a second portion located below the first portion.

4. The plasma processing apparatus of claim 3, wherein the inner wall of the processing container in the plan view is shaped such that the first portion is quadrangular and the second portion is circular.

5. The plasma processing apparatus of claim 1- or 2, wherein a shape of an inner wall of the processing container in a plan view differs between a first portion directly below the dielectric top plate and a second portion located below the first portion.

6. The plasma processing apparatus of claim 5, wherein the inner wall of the processing container in the plan view is shaped such that the first portion is quadrangular and the second portion is circular.

7. The plasma processing apparatus of claim 6, wherein an inner wall of the first portion in a plan view has a same shape as the dielectric top plate in a plan view, and has a size equal to or smaller than that of the dielectric top plate in the plan view.

8. The plasma processing apparatus of claim 6, wherein the first portion has a thickness of 20 mm or more.

9. The plasma processing apparatus of claim 8, wherein an inner wall of the first portion in a plan view has a same shape as the dielectric top plate in a plan view, and has a size equal to or smaller than that of the dielectric top plate in the plan view.

10. The plasma processing apparatus of claim 5, wherein the first portion has a thickness of 20 mm or more.

11. The plasma processing apparatus of claim 5, wherein an inner wall of the first portion in a plan view has a same shape as the dielectric top plate in a plan view, and has a size equal to or smaller than that of the dielectric top plate in the plan view.

12. The plasma processing apparatus of claim 1, wherein a thickness of the dielectric top plate is in a range of $\lambda g/2 \pm \lambda g/20$ with respect to an effective wavelength $\lambda g$ of a microwave which is incident from the electromagnetic wave emitting ports.

13. The plasma processing apparatus of claim 1, wherein long sides of neighboring electromagnetic wave emitting ports among the four electromagnetic wave emitting ports are oriented to be perpendicular to each other.

14. The plasma processing apparatus of claim 1, wherein four electromagnetic waves whose phases are controlled are simultaneously incident from the four electromagnetic wave emitting ports, and the four electromagnetic waves are synthesized inside the dielectric top plate.

15. The plasma processing apparatus of claim 1, wherein the four electromagnetic wave emitting ports have a same shape.

16. The plasma processing apparatus of claim 1, wherein a length ratio of the long side to the short side of each of the four electromagnetic wave emitting ports is 3.5 to 4.0.

17. A method of plasma processing a substrate to be processed using a plasma processing apparatus, the plasma processing apparatus comprising a processing container configured such that the substrate to be processed is subjected to plasma processing, a dielectric top plate which is a quadrangular shape in a plan view and is provided to close an upper opening of the processing container, and a conductor plate supporting the dielectric top plate and having four electromagnetic wave emitting ports for emitting electromagnetic waves to the dielectric top plate, wherein each of the four electromagnetic wave emitting ports have a rectangular shape having long side and short side in a plan view, and the four electromagnetic wave emitting ports are arranged such that the long side of each of the four electromagnetic wave emitting ports are parallel to a closest side among four sides of the dielectric top plate forming the quadrangular shape, and long sides of two electromagnetic wave emitting ports oriented in a same direction do not overlap each other in the same direction, the method comprising:

preparing the substrate to be processed in the processing container;

controlling phases of electromagnetic waves emitted from the four electromagnetic wave emitting ports; and processing the substrate to be processed with plasma generated by the electromagnetic waves emitted from the four electromagnetic wave emitting ports.

18. The method of claim 17, wherein, in the controlling the phases, the phases of the electromagnetic waves emitted from the four electromagnetic wave emitting ports are controlled with reference to a storage part which previously stores information indicating a relationship between the phases of the electromagnetic waves emitted from the four electromagnetic wave emitting ports and electric field distribution in the plasma.

* * * * *